(12) United States Patent
Aiura et al.

(10) Patent No.: US 6,686,859 B2
(45) Date of Patent: Feb. 3, 2004

(54) DIGITAL-TO-ANALOG-CONVERTER

(75) Inventors: Masami Aiura, Sendai (JP); Satoshi Takahashi, Sendai (JP); Yuichi Nakatani, Sendai (JP)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/351,724

(22) Filed: Jan. 27, 2003

(65) Prior Publication Data

US 2003/0151536 A1 Aug. 14, 2003

(30) Foreign Application Priority Data

Feb. 14, 2002 (JP) ........................................ 2002-037135

(51) Int. Cl.[7] ................................................. H03M 1/66
(52) U.S. Cl. ......................................................... 341/144
(58) Field of Search ................................. 341/144, 153; 307/43

(56) References Cited

U.S. PATENT DOCUMENTS

| | | | | |
|---|---|---|---|---|
| 5,696,512 A | * | 12/1997 | Takiguchi | 341/144 |
| 5,815,103 A | * | 9/1998 | Comminges et al. | 341/144 |
| 6,346,901 B1 | * | 2/2002 | Aiura et al. | 341/153 |
| 6,400,298 B1 | * | 6/2002 | Lee | 341/144 |

* cited by examiner

*Primary Examiner*—Peguy JeanPierre (57) ABSTRACT

It is an objective to provide a digital-to-analog converter circuit that allows the value of the current output from each current source cell to be identical, regardless of the position of that current source cell relative to the power supply line. To ensure that the voltages supplied to the respective current source cells are identical, the power supply lines La and Lb are disposed in the form of a right triangle modified such that their line widths W1 and W2 become constantly narrower on one side depending on the position at which the power supply lines La and Lb are formed. The power supply lines La and Lb are also disposed such that their hypotenuses are opposite to each other.

6 Claims, 7 Drawing Sheets

DIGITAL-TO-ANALOG-CONVERTER

BACKGROUND OF THE INVENTION

The present invention relates to digital-to-analog converter circuits.

Figure 11:
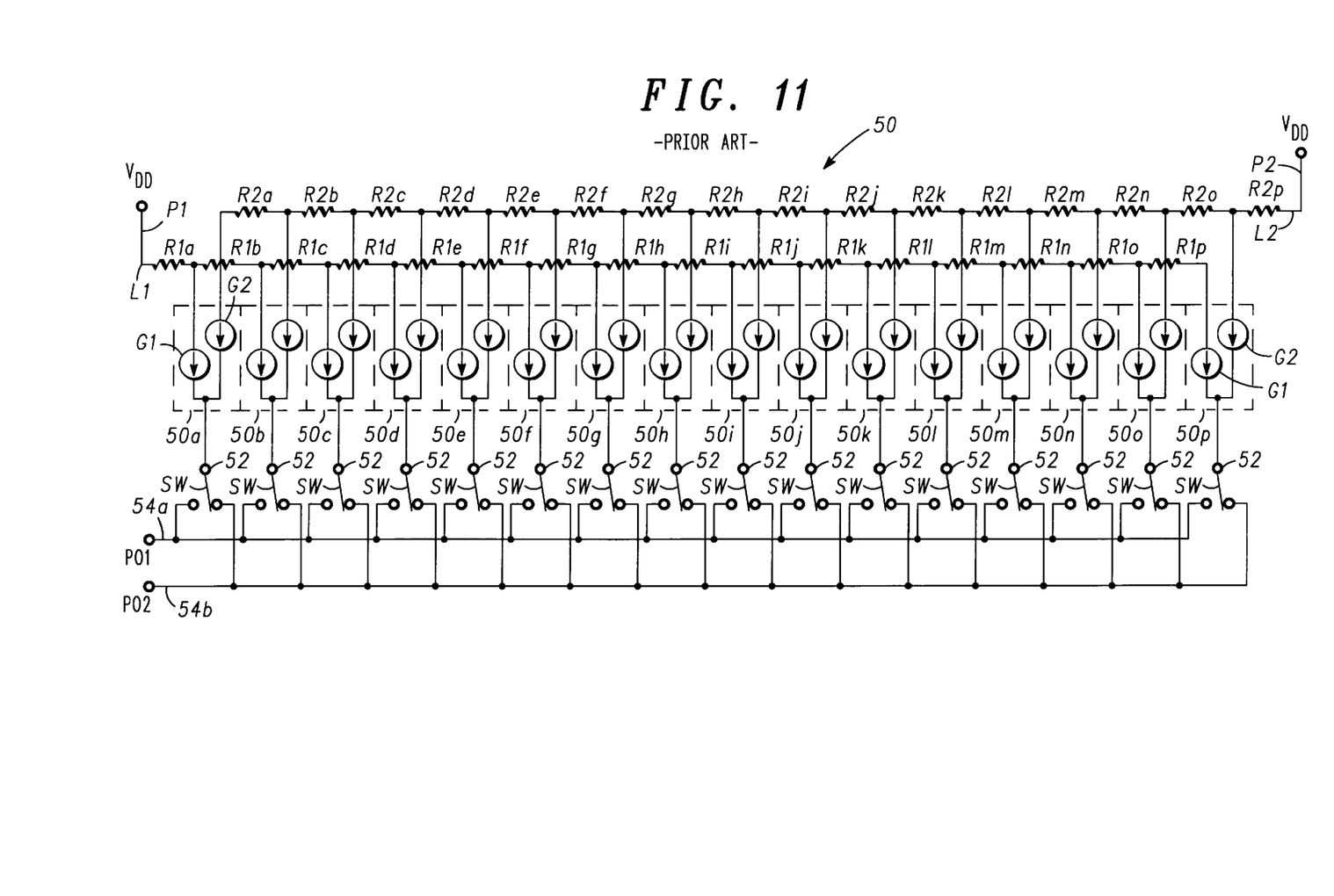
FIG. 11 is a circuit diagram of a prior art current output type digital-to-analog converter circuit.

Conventionally, as one of digital-to-analog converter circuits, there is a current output type digital-to-analog converter that is ideally suited for image signal processing. FIG. 11 is a circuit diagram depicting one example of a current output type digital-to-analog converter circuit formed on a semiconductor chip, where its input digital data is 4 bits.

In FIG. 11, the current output type digital-to-analog converter circuit 50 has sixteen current source cells 51a–51p disposed at regular intervals. Each of the current source cells 51a–51p comprises first and second constant current sources G1 and G2, respectively, that share an output terminal 52 thereof.

Each of the output terminals 52 is electrically connected to first and second analog output lines 54a and 54b via a changeover switch SW, respectively. Each of the changeover switches SW is electrically connected to a decoder circuit, which is not shown. Each changeover switch SW is designed so that the output terminal 52 is electrically connected to either of a first analog output line 54a or a second analog output line 54b in accordance with a control signal from the decoder circuit.

The first constant current source G1 of the respective current source cells 51a–51p is connected to a first power supply pad P1 via a first power supply line L1, respectively. The second constant current source G2 of the respective current source cells 51a–51p is also connected to a second power supply pad P2 via a second power supply line L2, respectively. The first and second power supply lines L1 and L2 are arranged along the respective current source cells 51a–51p in parallel to each other.

On the left-most end of the first power supply line L1 in FIG. 11 is formed the first power supply pad P1, to which direct-current (DC) voltage Vdd is applied to supply DC voltage to the first constant current source G1 of the respective current source cells 51a–51p. On the right-most end of the second power supply line L2 in FIG. 11 is formed the second power supply pad P2, to which DC voltage Vdd is also applied to supply DC voltage to the second constant current source G2 of the respective current source cells 51a–51p.

The changeover switch SW selected in accordance with the input digital data to the decoder circuit is turned ON or OFF. The currents generated at the first and second constant current sources G1 and G2 of the current source cells 51a–51p are summed, and the resulting summed output current is output as an analog signal from either of output terminals PO1 or PO2. That is, digital-to-analog conversion is performed.

The value of the current output from each of the current source cells 51a–51p is required to be identical. For the output currents from the current source cells 51a–51p to be identical, the voltages supplied to the current source cells 51a–51p all need to be identical. Thus, the digital-to-analog converter circuit 50 shown in FIG. 11 is designed to supply DC voltage Vdd, in different directions, to the first and second constant current sources G1 and G2 of the current source cells 51a–51p via the first and second power supply lines L1 and L2, respectively.

More specifically, line resistances R1a–R1p exist across the first power supply line L1, and line resistances R2a–R2p exist across the second power supply line L2. It should be appreciated that the line resistances R1a–R1p and R2a–R2p all have the same value. Thus, the first constant current source G1 of the current source cells 51a–51p has an increasingly lower voltage supplied thereto, because the further it is away from the first power supply pad P1, the greater the amount of voltage drop. The second constant current source G2 of the current source cells 51a–51p has an increasingly lower voltage supplied thereto, because the further it is away from the second power supply pad P2, the greater the amount of voltage drop.

Meanwhile, each of the constant current sources G1 and G2 of the current source cells 51a–51p is all driven by a common voltage. Thus, the value of the output current output by the current source cells 51a–51p is dependent upon a potential difference between the bias supply terminals (not shown) of the constant current sources G1 and G2 and the power supply terminals of the constant current sources G1 and G2 connected to the first and second power supply lines.

As a result, at each of the current source cells 51a–51p, the voltages supplied to the first and second constant current sources G1 and G2 and the cell positions are in reverse direction to each other. Accordingly, the output currents of the first and second constant current sources G1 and G2 at the respective current cells 51a–51p also similarly have reverse current output characteristics depending upon the cell position. It should be appreciated that because the output current at the respective current cell 51a–51p is the sum of the currents output from the two constant current sources G1 and G2 within that current cell, the output current from the current cell 51a–51p remains constant as the effects of the power supply lines L1 and L2 cancel each other out.

Figure 12:
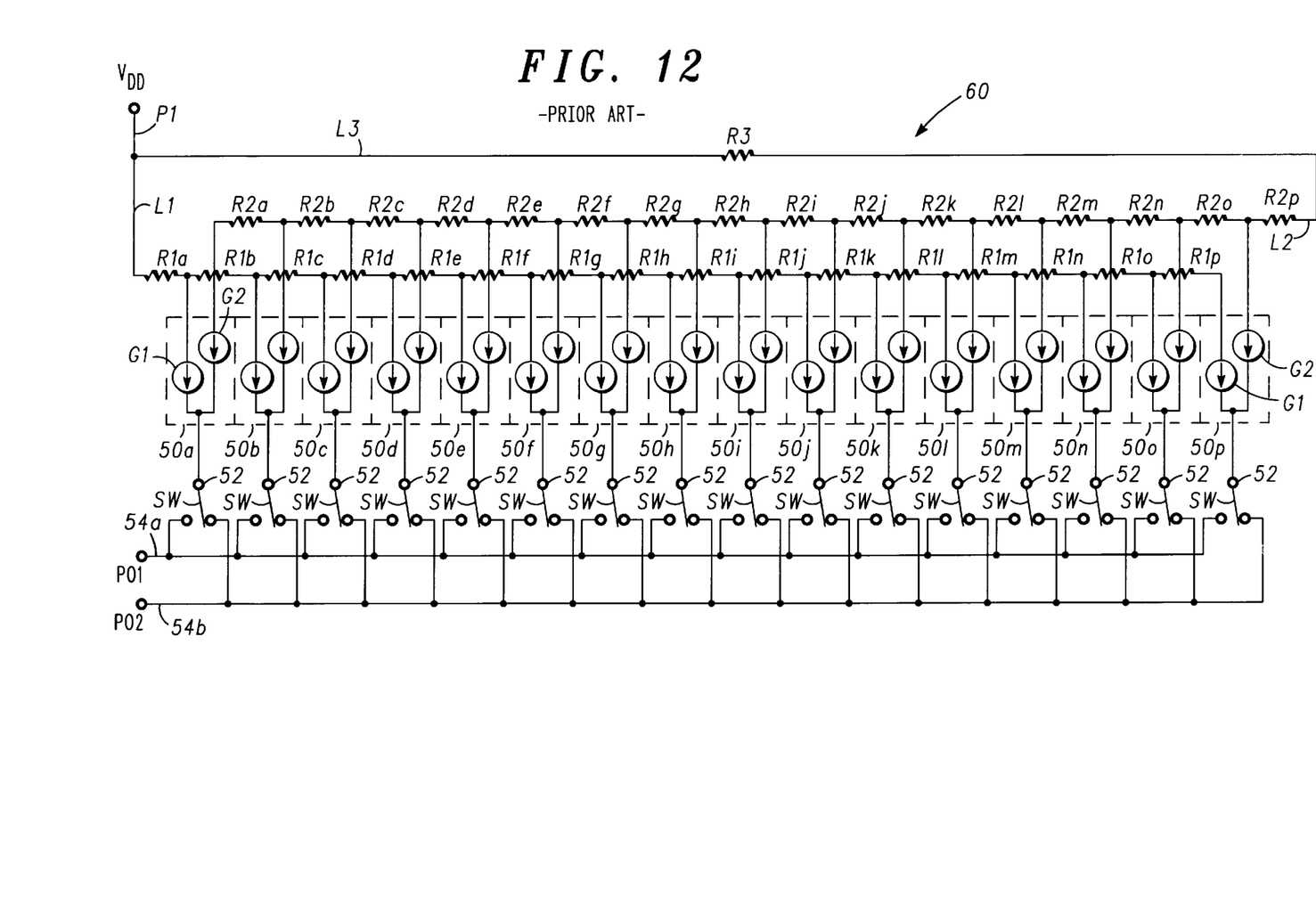
FIG. 12 is a circuit diagram of another prior art current output type digital-to-analog converter circuit.

A method to correct the voltage drops due to the line resistances R1a–R1p and R2a–R2p of the power supply lines L1 and L2 to make the values of the output currents output from the current source cells 51a–51p identical, is a current output type digital-to-analog converter circuit shown in FIG. 12. The current output type digital-to-analog converter circuit 60 shown in FIG. 12 omits the second power supply pad P2, so that DC voltage is supplied directly from the first power supply pad P1 to the first and second power supply lines L1 and L2. In this case, the first power supply pad P1 is electrically connected to the right-most end of the second power supply line L2 via a bypass line L3. It should be appreciated that the bypass line L3 has a line resistance R3 in a similar manner to the first and second power supply lines L1 and L2. Thus, to the second power supply line L2 is supplied the value of the DC voltage Vdd less the voltage drop due to the line resistance R3. In this case, the value of the output currents output from the respective current source cells 51a–51p are also similarly made identical.

Figure 13:
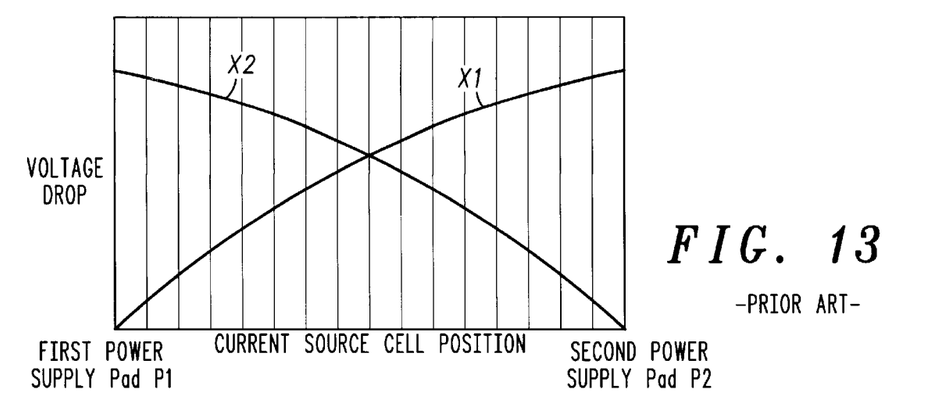
FIG. 13 is a chart depicting the amount of voltage drop at each position of each power line due to line resistance in the prior art current output type digital-to-analog converter circuit.

However, as shown by the characteristic curve X1 in FIG. 13, the amount of voltage drop at each position of the first power supply line L1 due to the line resistances R1a–R1p actually changes as a quadratic function. Similarly, as shown by the characteristic curve X2 in FIG. 13, the amount of voltage drop at each position of the second power supply line L2 due to the line resistances R2a–R2p actually changes as a quadratic function.

More specifically, the current value at portions of the first and second power supply lines L1 and L2 that are closer to the first and second power supply pads P1 and P2 is greater, whereas the current equivalent to one cell of the current source cells 51a–51p flows at portions of the first and second power supply lines L1 and L2 that are furthest away therefrom. In this way, if the current flowing through the first and second power supply lines L1 and L2 increases, the amount of voltage drop developed across the first and second power supply lines L1 and L2 having the constant line resistance is an integral value of the voltage drops across the respective line resistances R1a–R1p and R2a–R2p. As a result, the characteristic curves X1 and X2 nearly follow the quadratic function.

Figure 14:
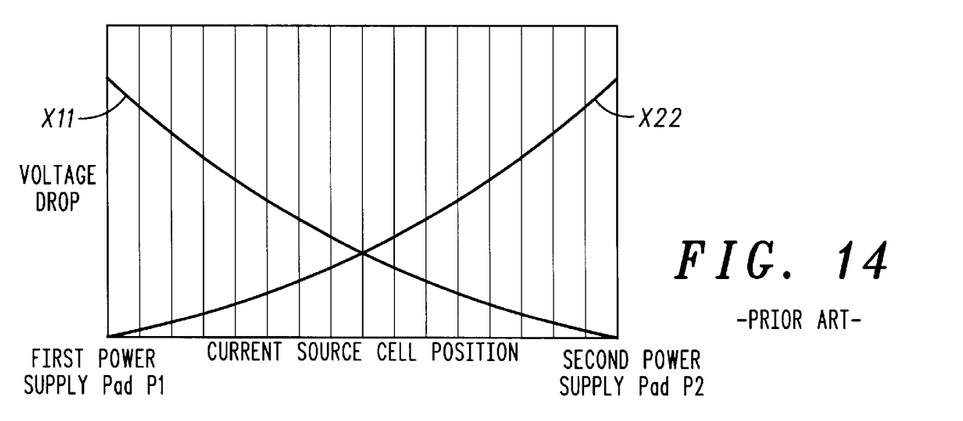
FIG. 14 is a chart depicting the output current at each current cell in the same current output type digital-to-analog converter circuit.
Figure 15:
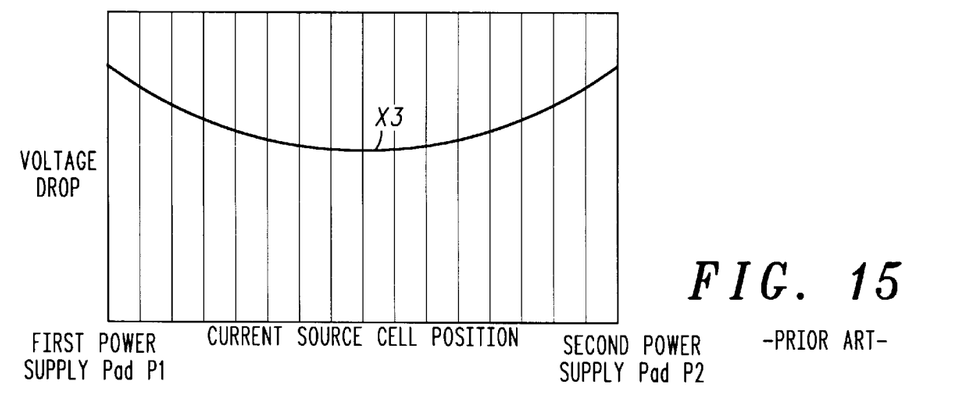
FIG. 15 is a chart depicting the output current at each position where output currents at the respective positions are summed for each power supply line in the same current output type digital-to-analog converter circuit.

Thus, at each of the current cells 51a–51p, the output current of the first constant current source G1 has a characteristic as represented by the characteristic curve X11 in FIG. 14, while the output current of the second constant current source G2 has a characteristic as represented by the characteristic curve X22 in FIG. 14. Here, the output current at the respective current cell 51a–51p is a sum of the currents output, respectively, from the two constant current sources G1 and G2 within that current cell. Thus, the output current of each current source cell 51a–51p has a characteristic as represented by the characteristic curve X3 shown in FIG. 15; as such, the values of the output currents of the current cells 51a–51p would not become identical, although the effects of the power supply lines L1 and L2 might be reduced.

The current output type digital-to-analog converter circuit shown in FIG. 12 also has a similar problem. The present invention is intended to solve the afore-described problem and has as its objective to provide a digital-to-analog converter circuit such that the values of the output currents output from the respective current source cells are identical regardless of the position of the current source cells relative to the power supply lines.

SUMMARY OF THE INVENTION

The invention according to claim 1 is a digital-to-analog converter circuit, wherein a plurality of current source cells having a first constant current source and a second constant current source are arranged in one direction; a first power supply line corresponding to the first constant current source of the respective current source cell and a second power supply line corresponding to the second constant current source of the respective current source cell are arranged in such a direction that the current source cells are arranged; a changeover switch disposed respectively for the respective current source cell is selectively operated in accordance with input digital data so that the output current from the current source cell is output to either of a first analog output line or a second analog output line, said digital-to-analog converter circuit is characterized by: line widths of said first and second power supply lines being modified depending upon the position at which they are formed, respectively, so that the average value of the voltages supplied to said respective current source cells becomes uniform.

The invention of claim 2 is the digital-to-analog converter circuit according to claim 1, wherein the first and second power supply lines are modified so that the line widths thereof become continuously narrower as they are further away from the power supply pads, respectively.

The invention of claim 3 is the digital-to-analog converter circuit according to claim 2, wherein the first and second power supply lines are in the form of a right triangle, respectively, and are disposed so that the hypotenuses thereof are opposite to each other.

The invention of claim 4 is the digital-to-analog converter circuit according to claim 1, wherein the first and second power supply lines are modified so that the line widths thereof become narrower in stepwise manner as they are further away from the power supply pads, respectively.

The invention of claim 5 is the digital-to-analog converter circuit according to claim 1, wherein the first and second power supply lines comprise a plurality of lines having a constant line width; and the lines are modified so that the number of the lines becomes smaller as they are further away from the power supply pads, respectively.

The invention of claim 6 is the digital-to-analog converter circuit according to claim 4, wherein the first and second power supply lines have one sides thereof modified in stepwise manner depending upon the position of the current source cell, and are disposed so that the one sides thereof are opposite to each other. According to the invention described in claims 1 through 6, by modifying the line widths of the first and second power supply lines to adjust the line resistance thereof, the average value of the voltage supplied to the respective current source cells is made uniform. Thus, the value of the output current output from the current source cells can be made identical regardless of the positions of the current source cells.

Additionally, according to the invention described in claims 2 and 4, the line resistances of the power supply lines can be adjusted easily. Still additionally, according to the invention described in claims 3 and 6, the area occupied by both of the power supply lines can be reduced, thereby enhancing the degree of integration for the digital-to-analog converter circuit.

Furthermore, according to the invention described in claim 5, the first and second power supply lines with the line widths thereof modified can be formed easily.

DETAILED DESCRIPTION OF THE INVENTION

Figure 1:
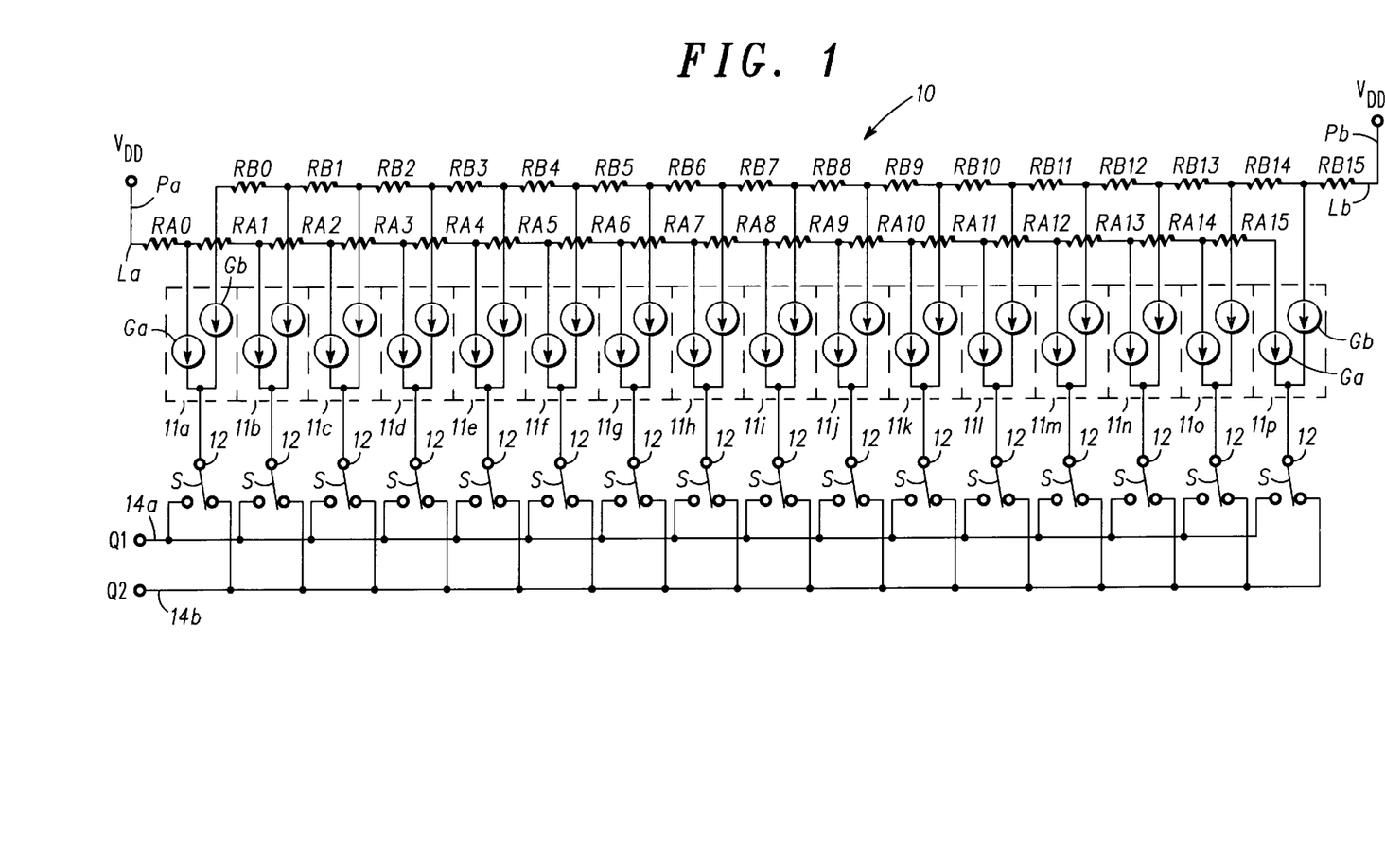
FIG. 1 is a circuit diagram of a current output type digital-to-analog converter circuit according to an embodiment of the present invention.

One embodiment of the digital-to-analog converter circuit that embodies the present invention is described below with reference to the accompanying drawings. FIG. 1 is a circuit diagram depicting one example of a current output type digital-to-analog converter circuit formed on a semiconductor chip, where its input digital data is 4 bits.

In FIG. 1, the current output type digital-to-analog converter circuit 10 has sixteen current source cells 11a–11p arranged at regular intervals. Each of the current source cells 11a–11p is comprised of first and second constant current sources Ga and Gb, respectively, that share an output terminal 12 thereof.

Each of the output terminals 12 is electrically connected to first and second analog output lines 14a and 14b via a changeover switch S, respectively. Each of the changeover switches S is electrically connected to a decoder circuit, which is not shown. Each changeover switch S is designed so that the output terminal 12 is electrically connected to either of a first analog output line 14a or a second analog output line 14b in accordance with a control signal from the decoder circuit.

The first constant current source Ga of the respective current source cells 11a–11p is connected to a first power supply pad Pa, which serves as a power supply pad, via a first power supply line La, respectively. The second constant current source Gb of the respective current source cells 11a–11p is connected to a second power supply pad Pb, which serves as a power supply pad, via a second power supply line Lb, respectively. The first and second power supply lines La and Lb are arranged along the respective current source cells 11a–11p in parallel to each other.

On the left-most end of the first power supply line La in FIG. 1 is formed the first power supply pad Pa, to which direct-current (DC) voltage Vdd is applied to supply DC voltage to the first constant current source Ga of the respective current source cells 11a–11p. On the right-most end of the second power supply line Lb in FIG. 1 is formed the second power supply pad Pb, to which DC voltage Vdd is also applied to supply DC voltage to the second constant current source Gb of the respective current source cells 11a–11p.

The changeover switch S selected in accordance with the input digital data to the decoder circuit is turned ON or OFF. The currents generated at the first and second constant current sources Ga and Gb of the current source cells 11a–11p are summed. The resulting summed output current is output as an analog signal from either of a first analog output terminal Q1 or a second analog output terminal Q2. That is, digital-to-analog conversion is performed.

In the current output type digital-to-analog converter circuit 10 so configured, the power supply lines La and Lb are aluminum-made power supply lines disposed through lamination on a semiconductor chip by use of, for example, evaporation.

Figure 2:
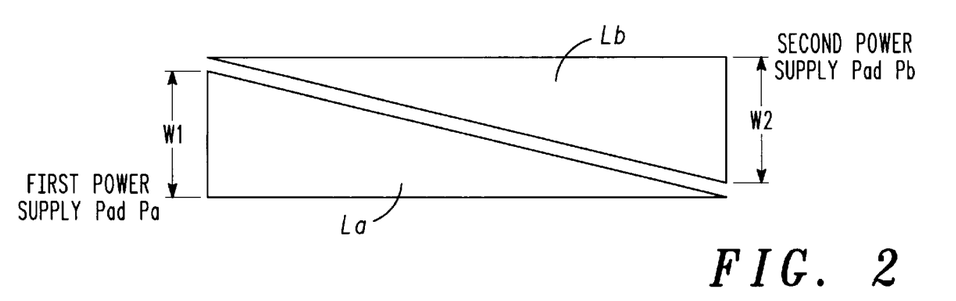
FIG. 2 is a plan view of first and second power supply lines of the same current output type digital-to-analog converter circuit.

As shown in FIG. 2, the power supply lines La and Lb are respectively in the form of a right triangle such that line widths W1 and W2 of the first and second power supply lines become continuously narrower on one side thereof depending upon the position at which the power supply lines La and Lb are formed, and are disposed so that the hypotenuses thereof are opposite to each other.

More specifically, the power supply line La is formed so that its line width W1 becomes narrower as it is further away from the first power supply pad Pa, as shown in FIG. 2. The power supply line La is also disposed so that its height (film thickness) becomes constant along the length of the power supply line La.

Thus, the cross-sectional area of the power supply line La becomes smaller as it is further away from the first power supply pad Pa. This means that the magnitude of respective line resistances RA0–RA15 of the power supply line La becomes continuously greater as it is further away from the first power supply pad Pa. Additionally, in the present embedment, the magnitude of the line resistance RA15 is formed so as to be sixteen times the magnitude of the line resistance RA0.

Incidentally, the magnitudes of the line resistances RA0–RA15 assume the following relationship:

$$RA0 = (RA1)/2 = (RA2)/3 = (RA3)/4 = (RA4)/5 = (RA5)/6 = (RA6)/7 = (RA7)/8 = (RA8)/9 = (RA9)/10 = (RA10)/11 = (RA11)/12 = (RA12)/13 = (RA13)/14 = (RA14)/15 = (RA15)/16$$

The power supply line La so disposed is electrically connected, in order from the end having the wider line width W1 thereof, to the first constant current source Ga of the current source cell 11a, the first constant current source Ga of the current source cell 11b, . . . , and so forth. The end of the power supply line La having the narrowest line width W1 is electrically connected to the first constant current source Ga of the current source cell 11p.

On the other hand, the power supply line Lb is identically shaped as the power supply line La, and formed so that its line width W2 (=W1) becomes narrower as it is further away from the second power supply pad Pb. The power supply line Lb is also disposed so that its height (film thickness) becomes constant along the length thereof.

Thus, the cross-sectional area of the power supply line Lb becomes smaller as it is further away from the second power supply pad Pb. This means that the magnitude of respective line resistances RB0–RB15 of the power supply line Lb becomes continuously greater as it is further away from the second power supply pad Pb. Additionally, in the present embodiment, the magnitude of the line resistance RB0 is formed so as to be sixteen times the magnitude of the line resistance RB15.

Incidentally, the magnitudes of the line resistances RB0–RB15 assume the following relationship:

$$(RB0)/16 = (RB1)/15 = (RB2)/14 = (RB3)/13 = (RB4)/12 = (RB5)/11 = (RB6)/10 = (RB7)/9 = (RB8)/8 = (RB9)/7 = (RB10)/6 = (RB11)/5 = (RB12)/4 = (RB13)/3 = (RB14)/2 = RB15$$

The power supply line Lb so formed is electrically connected, in order from the end having the narrower line width W2 thereof, to the second constant current source Gb of the current source cell 11a, the second constant current source Gb of the current source cell 11b, . . . , and so forth. The end of the power supply line Lb having the widest line width W2 is electrically connected to the second constant current source Gb of the current source cell 11p.

Thus, because the further away from the first power supply pad Pa, the greater the respective line resistances RA0–RA15 of the power supply line La, the voltage supplied from the first power supply pad Pa to the first constant current source GA of the respective current source cell 11a–11p becomes smaller in proportion to the position of the current source cells 11a–11p.

Similarly, because the further away from the second power supply pad Pb, the greater the respective line resistances RB0–RB15 of the power supply line Lb, the voltage supplied from the second power supply pad Pb to the second constant current source Gb of the respective current source cells 11a–11p becomes smaller in proportion to the position of the current source cells 11a–11p.

Figure 3:
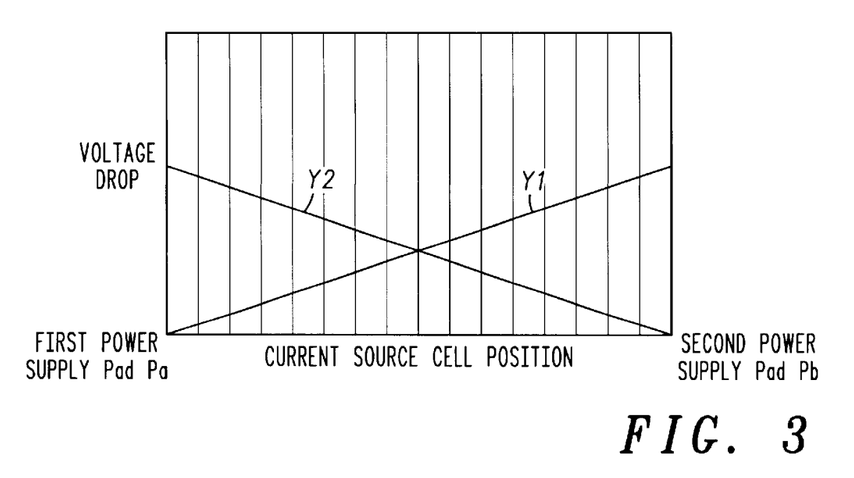
FIG. 3 is a chart depicting the amount of voltage drop at each position of the power supply line due to the respective line resistance in the same current output type digital-to-analog converter circuit.

In other words, the amount of voltage drop at each position of the first power supply line La due to the line resistances RA0–RA15 is represented by a linear function, as indicated by the characteristic curve Y1 in FIG. 3. Similarly, the amount of voltage drop at each position of the second power supply line Lb due to the line resistances RB0–RBl5 is represented by a linear function, as indicated by the characteristic curve Y2 in FIG. 3. Additionally, portions of the first and second power supply lines La and Lb that are closer to the first and second power supply pads Pa and Pb have greater current values, whereas the current equivalent to one cell of the current source cells 11a–11p flows at portions of the first and second power supply lines La and Lb that are furthest away therefrom.

Figure 4:
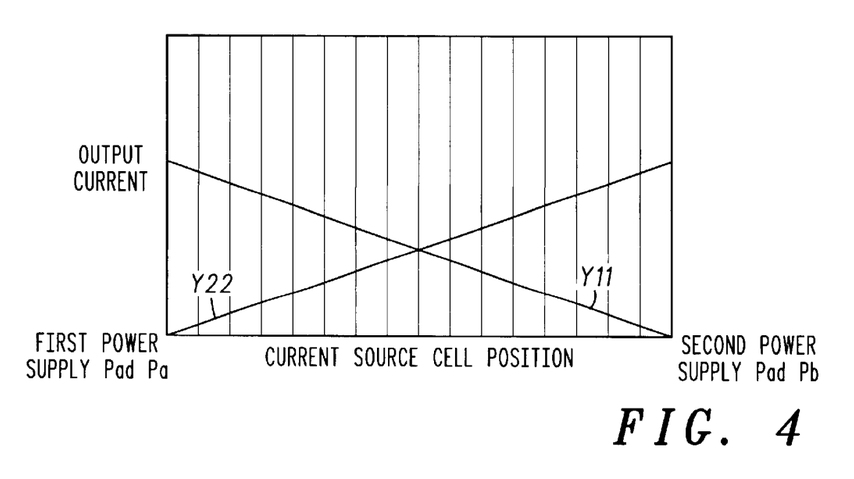
FIG. 4 is a chart depicting the output current at each current cell in the same current output type digital-to-analog converter circuit.
Figure 5:
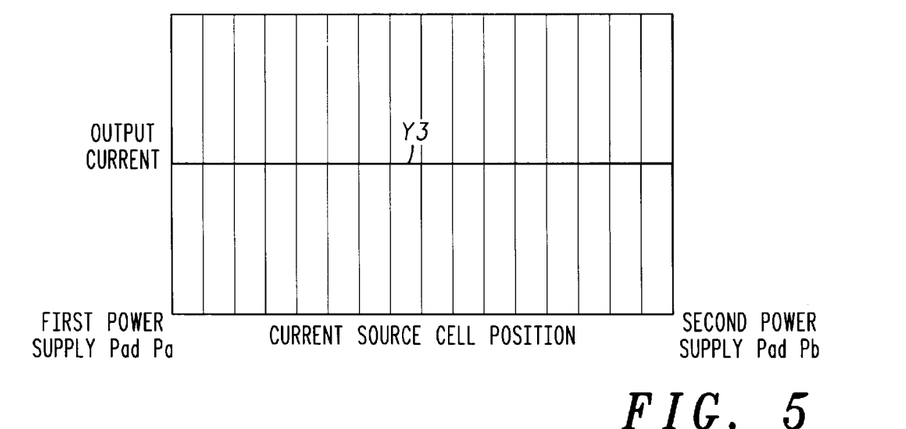
FIG. 5 is a chart depicting the output current at each position where output currents at the respective positions are summed for each power supply line in the same current output type digital-to-analog converter circuit.

Thus, at each of the current cells 11a–11p, the output current of the first constant current source Ga has a characteristic as represented by the characteristic curve Y11 in FIG. 4, while the output current of the second constant current source Gb has a characteristic as represented by the characteristic curve Y22 in FIG. 4. Here, the output current at the respective current cell 11a–11p is a sum of the currents output from the two constant current sources Ga and Gb within the current cell 11a–11p; as such, the output current of the respective current cell 11a–11p has a characteristic as represented by the characteristic curve Y3 shown in FIG. 5. Thus, the values of the output currents of the current cells 11a–11p are identical.

Accordingly, the digital-to-analog converter circuit 10 ensures that the values of the output currents output from the respective current source cells 11a–11p are identical, regardless of the position of the current source cells 11a–11p relative to the power supply lines La and Lb.

The digital-to-analog converter circuit according to the afore-described embodiment can provide the following features:

(1) In the afore-described embodiment, the line widths W1 and W2 of the power supply lines La and Lb are modified so that one side thereof becomes continuously narrower depending upon the position at which the power supply lines La and Lb are formed, thereby adjusting the line resistances RA0–RA15 and RB0–RB15. Additionally, the average value of the voltage supplied to the respective current source cells 11a–11p is made uniform. Thus, the value of the output current output from the current source cells 11a–11p can be made identical, regardless of the position of the current source cells 11a–11p. As a result, the output current of the respective current source cell 11a–11p can be made uniform.

(2) In the afore-described embodiment, by merely modifying the line widths W1 and W2 of the power supply lines La and Lb so that one side thereof becomes continuously narrower depending upon the position at which the power supply lines La and Lb are formed, the magnitudes of the respective line resistances RA0–RA15 and RB0–RB15 can be adjusted easily.

(3) In the afore-described embedment, the power supply lines La and Lb are in the form of a right triangle modified so that the line widths W1 and W2 thereof becomes continuously narrower depending upon the position at which the power supply lines La and Lb are formed, and are disposed so that the hypotenuses thereof are opposite to each other. By disposing the power supply lines La and Lb in this manner, the area occupied by both of the power supply lines can be reduced, thereby enhancing the degree of integration for the digital-to-analog converter circuit.

Figure 6:
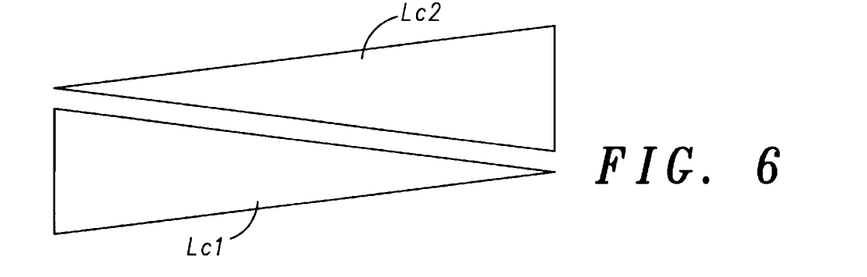
FIG. 6 is a plan view of the power supply lines for explaining another example of the present invention.

It should be appreciated that the afore-described embodiment may be changed as follows. Although, in the afore-described embodiment, the first and second power supply lines La and Lb are disposed in the form of a right triangle, first and second power supply lines Lc1 and Lc2 may be formed in tapered fashion with two sides thereof changing continuously, and are disposed so that they face each other, as shown in FIG. 6. In so doing, the value of the output current output from the respective current source cells 11a–11p can be made identical, regardless of the position of the current source cells 11a–11p relative to the first and second power supply lines Lc1 and Lc2.

Figure 7:
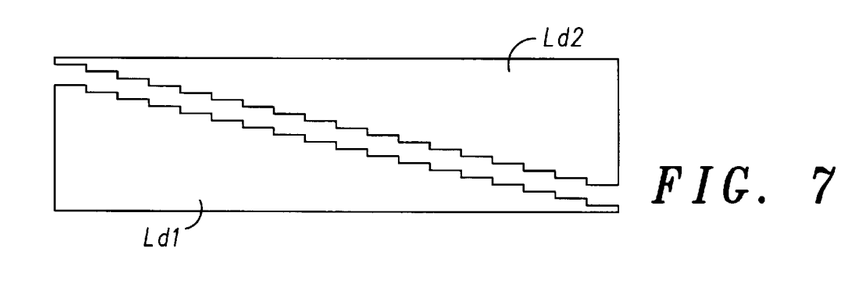
FIG. 7 is a plan view of the power supply lines for explaining another example of the present invention.

Although, in the afore-described embodiment, the first and second power supply lines La and Lb are disposed in the form of a right triangle, first and second power supply lines Ld1 and Ld2 may be formed so that one side thereof is modified in stepwise manner, and are disposed so that the one sides thereof face each other, as shown in FIG. 7. In so doing, a similar benefit to the afore-described embodiment can be provided.

Figure 8:
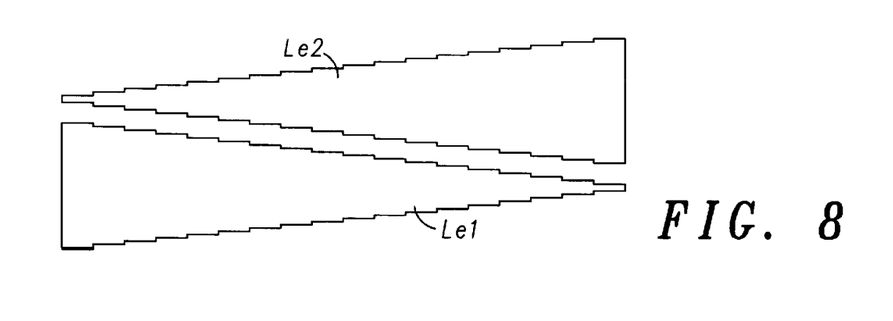
FIG. 8 is a plan view of the power supply lines for explaining another example of the present invention.

Although, in the afore-described embodiment, the first and second power supply lines La and Lb are disposed in the form of a right triangle, first and second power supply lines Le1 and Le2 may be formed so that both sides thereof are modified in stepwise manner, and are disposed so that they face each other, as shown in FIG. 8. In so doing, a similar benefit to the afore-described embodiment can be provided.

Although, in the afore-described embodiment, the first and second power supply pads Pa and Pb as shown in FIG. 1 are implemented in an independent current output type digital-to-analog converter circuit, they may be implemented in a current output type digital-to-analog converter circuit as shown in FIG. 12.

Although, in the afore-described embodiment, the digital-to-analog converter circuit having 4-bit input digital data is embodied, a digital-to-analog converter circuit having other than 4-bit input digital data may also be embodied.

Although, in the afore-described embodiment, the respective current source cell 11a–11p is comprised of two constant current sources Ga and Gb, the current source cell 11a–11p may be comprised of two or more constant current sources arranged at regular intervals. For example, the respective current source cell 11a–11p may be comprised of four constant current sources arranged at regular intervals, where the four constant current sources are connected alternatively to the first and second power supply lines La and Lb.

Figure 9:
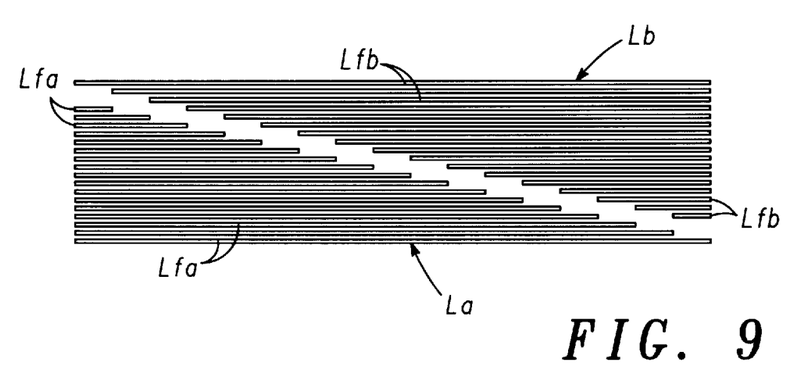
FIG. 9 is a plan view of the power supply lines for explaining another example of the present invention.

In the afore-described embodiment, the first and second power supply lines are formed as single lines. The first power supply line may also be comprised of a plurality of lines Lfa so that the number of the lines becomes smaller as they are further away from the first power supply pad Pa. Similarly, the second power supply line Lb may also be comprised of a plurality of lines Lfb so that the number of the lines becomes smaller as they are further away from the second power supply pad Pb. In this case, the respective lines Lfa and Lfb are electrically connected to each other via a wire (not shown) at each position where the respective current source cell 11a–11p is arranged. In so doing, a similar benefit to the afore-described embodiment can be provided, as well as facilitating the formation of power supply lines with their line widths modified.

Figure 10:
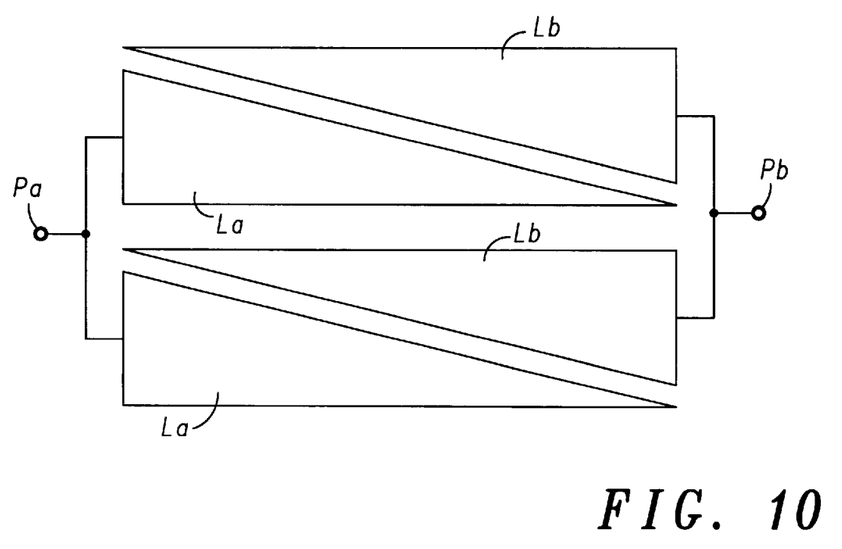
FIG. 10 is a plan view of the power supply lines for explaining another example of the present invention.

Although, in the afore-described embodiment, one pair of first and second power supply lines La and Lb are formed for the respective current source cell 11a–11p, multiple pairs thereof may also be configured. FIG. 10 shows a diagram where two pairs of first and second power supply lines La and Lb are configured for the respective current source cell 11a–11p. This can allow the magnitude of the respective line resistance to be adjusted by specifying the number of pairs as appropriate.

According to the invention described in claims 1 through 6, a digital-to-analog converter circuit can be provided which allows the value of the output current output from the respective current source cell to be identical, regardless of the position of that current source cell relative to the power supply line.

What is claimed is:

1. A digital-to-analog converter circuit, wherein a plurality of current source cells having a first constant current source and a second constant current source are arranged in one direction; a first power supply line corresponding to the first constant current source of a respective current source cell and a second power supply line corresponding to the second constant current source of a respective current source cell are arranged in such a direction that the current source cells are arranged; a changeover switch disposed respectively for each respective current source cell selectively operated in accordance with digital input data so that an output current from the current source cell is output to either of a first analog output line or a second analog output line, said digital-to-analog converter circuit characterized by:

line widths of said first and second power supply lines being modified depending upon a position at which they are formed, respectively, so that an average value of a voltages supplied to said respective current source cells becomes uniform.

2. The digital-to-analog converter circuit according to claim 1, wherein:

said first and second power supply lines are modified so that the line widths thereof become continuously narrower as they are further away from the power supply line pads, respectively.

3. The digital-to-analog converter circuit according to claim 2, wherein:

said first and second power supply lines are in the form of a right triangle, respectively, and are disposed so that the hypotenuses thereof are opposite to each other.

4. The digital-to-analog converter circuit according to claim 1, wherein:

said first and second power supply lines are modified so that the line widths thereof become narrower in stepwise manner as they are further away from the power supply line pads, respectively.

5. The digital-to-analog converter circuit according to claim 4, wherein:

said first and second power supply lines have one side thereof modified in stepwise manner depending upon a position of said current source cell, and are disposed so that said one side thereof are opposite to each other.

6. The digital-to-analog converter circuit according to claim 1, wherein:

said first and second power supply lines comprise a plurality of lines having a constant line width; and said plurality of lines are modified so that a number of said lines becomes smaller as they are further away from a power supply pads, respectively.

* * * * *